United States Patent
Bernius et al.

(10) Patent No.: US 6,204,515 B1
(45) Date of Patent: Mar. 20, 2001

(54) SEMICONDUCTING POLYMER FIELD EFFECT TRANSISTOR

(75) Inventors: Mark T. Bernius; Edmund P. Woo, both of Midland, MI (US)

(73) Assignee: The Dow Chemical Company, Midland, MI (US)

( * ) Notice: Subject to any disclaimer, the term of this patent is extended or adjusted under 35 U.S.C. 154(b) by 0 days.

(21) Appl. No.: 09/470,367

(22) Filed: Dec. 22, 1999

Related U.S. Application Data

(60) Provisional application No. 60/116,112, filed on Jan. 15, 1999.

(51) Int. Cl.$^7$ .............................. H01L 35/44; H01L 51/00
(52) U.S. Cl. ............................................ 257/40; 257/401
(58) Field of Search ........................................ 257/40, 401

(56) References Cited

U.S. PATENT DOCUMENTS

| | | | |
|---|---|---|---|
| 5,355,235 | 10/1994 | Nishizawa et al. | 359/59 |
| 5,705,826 | 1/1998 | Aratani et al. | 257/40 |
| 5,708,130 | 1/1998 | Woo et al. | 528/397 |
| 5,777,070 | 7/1998 | Inbasekaran et al. | 528/394 |
| 5,962,631 | 10/1999 | Woo et al. | 528/397 |

FOREIGN PATENT DOCUMENTS

| | | |
|---|---|---|
| 0 450 862 A2 | 10/1991 | (EP) . |
| 0 528 662 A1 | 2/1993 | (EP) . |
| WO 95/31833 | 11/1995 | (WO) . |
| WO 97/19142 | 5/1997 | (WO) . |
| WO 99/54385 | 10/1999 | (WO) . |

OTHER PUBLICATIONS

*Applied Physics Letters*, vol. 73, No. 11, "Nondispersive hole transport in an electroluminescent polyfluorene," M. Redecker, et al., pp. 1565–1567, Sep. 14, 1998.

*Advanced Materials*, vol. 11, No. 3, "High Mobility Hole Transport Fluorene–Triarylamine Copolymers," M. Redecker, et al., pp. 241–246, 1999.

*Thin Solid Films*, 266, "Control of electron transfer direction in an organic two–layer diode based on a lightly–doped poly(3–methylthiophene)/9–fluorenone derivatives junction," K. Uehara, et al., pp. 263–266, 1995.

*Synthetic Metals*, vol. 25, A. Tsumura, et al., "Polythiophene Field–Effect Transistor: Its Characteristics and Operation Mechanism," 1988, pp. 11–23.

*Solid State Communications*, vol. 72, No. 4, A. Horowitz, et al., A Field–Effect Transistor Based on Conjugated Alpha–Sexithienyl,: 1989, pp. 381–384.

(List continued on next page.)

*Primary Examiner*—Stephen D. Meier

(57) ABSTRACT

A field effect transistor is made of five parts. The first part is an insulator layer, the insulator layer being an electrical insulator such as silica, the insulator layer having a first side and a second side. The second part is a gate, the gate being an electrical conductor such as silver, the gate being positioned on the first side of the insulator layer. The third part is a semiconductor layer, the semiconductor layer including a polymer, at least ten weight percent of the monomer units of the polymer being a 9-substituted fluorene unit and/or a 9,9-substituted fluorene unit, the semiconductor layer having a first side, a second side, a first end and a second end, the second side of the semiconductor layer being on the second side of the insulator layer. The fourth part is a source, the source being an electrical conductor such as silver, the source being in electrical contact with the first end of the semiconductor layer. The fifth part is a drain, the drain being an electrical conductor such as silver, the drain being in electrical contact with the second end of the semiconductor layer. A negative voltage bias applied to the gate causes the formation of a conduction channel in the semiconductor layer from the source to the drain. On the other hand, a positive bias applied to the gate causes the formation of an electron conducting channel in the semiconductor layer.

11 Claims, 1 Drawing Sheet

OTHER PUBLICATIONS

*Can. J. Phys.*, vol. 70, Z. Xie, et al., "Electrical characteristics and photolytic tuning of poly(3–hexylthiophene) thin film metal–insulator–semiconductor field–effect transistors (MISFETs)," 1992, pp. 1171–1177.

*Nature*, vol. 335, J. H. Burroughes, et al., "New semiconductor device physics in polymer diodes and transistors," Sep. 8, 1988, pp. 137–141.

*Mater. Res. Soc. Bulletin*, vol. 22, Francis Garnier, et al., "Tunneling at Organic/Metal Interfaces in Oligomer–Based Thin–Film Transistors," Jun. 1997, pp. 52–56.

*Appl. Phys. Lett.*, vol. 58, H. Akimichi et al., "Field–effect transistors using alkyl substituted oligothiophenes," Apr. 8, 1991, pp. 1500–1502.

*Appl. Phys. Lett.*, vol. 63, H. Fuchigami, et al., "Polythienylenevinylene thin–film transistor with high carrier mobility," Sep. 6, 1993, pp. 1372–1374.

*Appl. Phys. Lett.*, vol. 53, A. Assadi, et al., "Field–effect mobility of poly(3–hexythiophene)," Jul. 18, 1988, pp. 195–197.

*J. Mater. Res.*, vol. 11, No. 6, A. J. Lovinger, et al., "Electrically active organic and polymeric materials for thin–film–transistor technologies," Jun. 1996, pp. 1581–1592.

*Appl. Phys. Lett.*, vol. 56, J. Paloheimo, et al., "Molecular field–effect transistors using conducting polymer Langmuir–Blodgett films," Mar. 19, 1990, pp. 1157–1159.

*Synthetic Metals*, vol. 54, P. Ostoja, et al., "Electrical characteristics of field–effect transistors formed with ordered α–sexithienyl," 1993, pp. 447–452.

SEMICONDUCTING POLYMER FIELD EFFECT TRANSISTOR

CROSS-REFERENCE TO RELATED APPLICATION

This application claims the benefit of U.S. Provisional Application Serial No. 60/116,112, filed Jan. 15, 1999.

FIELD OF THE INVENTION

The instant invention is in the field of transistors. More specifically, the instant invention is in the field of transistors based on semiconducting polymers.

BACKGROUND OF THE INVENTION

Transistors are important electronic devices. Metal oxide semiconductor field effect transistors (MOS FET) are well-known.

SUMMARY OF THE INVENTION

A field effect transistor comprises five elements. The first element is an insulator layer, the insulator layer being an electrical insulator, the insulator layer having a first side and a second side. The second element is a gate, the gate being an electrical conductor, the gate being positioned adjacent the first side of the insulator layer. The third element is a semiconductor layer, the semiconductor layer comprising a polymer, at least ten weight percent of the monomer units of the polymer being selected from the group consisting of a 9-substituted fluorene unit and a 9,9-substituted fluorene unit, the semiconductor layer having a first side, a second side, a first end and a second end, the second side of the semiconductor layer being adjacent the second side of the insulator layer. The fourth element is a source, the source being an electrical conductor, the source being in electrical contact with the first end of the semiconductor layer. The fifth element is a drain, the drain being an electrical conductor, the drain being in electrical contact with the second end of the semiconductor layer. A negative voltage bias applied to the gate causes the formation of a hole conduction channel in the semiconductor layer connecting the source to the drain. A positive bias applied to the gate causes the formation of an electron-conducting channel in the semiconductor layer.

DETAILED DESCRIPTION OF THE INVENTION

Figure 1:
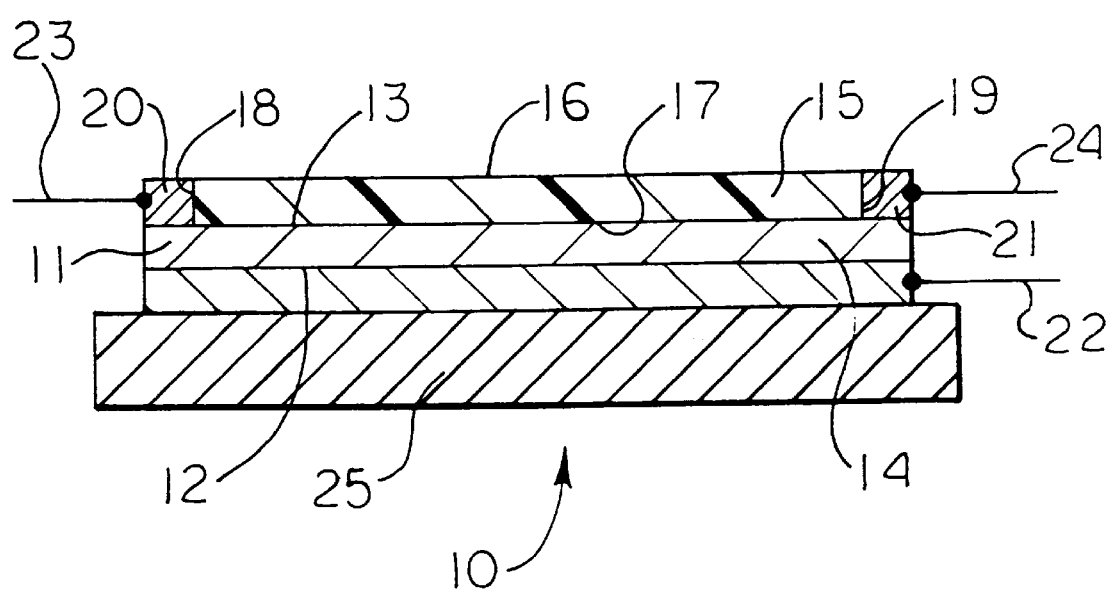
FIG. 1 is a cross-sectional side view of an embodiment of the instant invention.

The instant invention is termed herein as a "metal-insulator-semiconductor field effect transistor" (MISFET). The MISFET comprises a semiconductor layer adjacent an insulator layer. Two electrodes (source and drain) are attached to the semiconductor layer and a third electrode (gate) is positioned adjacent the other side of the insulator layer. The semiconductor layer comprises a polymer. At least ten weight percent of the monomer units of the polymer are selected from the group consisting of a 9-substituted fluorene unit and a 9,9-substituted fluorene unit. In a p-type field effect transistor, applying a negative DC voltage to the gate electrode induces an accumulation of "holes" near the insulator side of the semiconductor layer, creating a conduction channel through which electric current can flow by hole transport between the source and the drain so that the MISFET is in the "on" state. Zeroing the gate voltage causes a depletion of holes in the accumulation zone and cessation of current so that the MISFET is in the "off" state. The speed at which the MISFET can be turned on and off depends on the speed at which "holes" can travel from the source to the drain and, thus, on the mobility of the "holes". On the other hand, in an n-type field effect transistor, a positive bias applied to the gate causes the formation of an electron-conducting channel in the semiconductor layer.

Referring now to FIG. 1, therein is shown a side cross-sectional view of an apparatus embodiment 10 of the instant invention. The embodiment 10 comprises an insulator layer 11, the insulator layer 11 being an electrical insulator, the insulator layer 11 having a first side 12 and a second side 13. The embodiment 10 also comprises a gate 14, the gate 14 being an electrical conductor, the gate 14 being positioned adjacent (and preferably in contact with) the first side 12 of the insulator layer 11. The embodiment 10 also comprises a semiconductor layer 15, the semiconductor layer 15 comprising a polymer, at least ten weight percent of the monomer units of the polymer being selected from the group consisting of a 9-substituted fluorene unit and a 9,9-substituted fluorene unit, the semiconductor layer 15 having a first side 16, a second side 17, a first end 18 and a second end 19, the second side 17 of the semiconductor layer being adjacent (and preferably in contact with) the second side 13 of the insulator layer. The embodiment 10 also comprises a source 20, the source 20 being an electrical conductor, the source 20 being in electrical contact with the first end 18 of the semiconductor layer 15. The embodiment 10 also comprises a drain 21, the drain 21 being an electrical conductor, the drain 21 being in electrical contact with the second end 19 of the semiconductor layer 15. Electrical connection to the embodiment 10 is by way of electrical leads 22, 23 and 24 to the gate 14, the source 20 and the drain 21, respectively. The embodiment 10 also is shown as including an optional substrate 25 which serves as a structural base for the embodiment 10.

Referring still to FIG. 1, the embodiment 10 can be made by the following steps. First, the gate 14 is formed onto the substrate 25. The substrate 25 may be chosen from a variety of materials including silicon wafers, glass, or plastics. The gate 14 may be formed from any conductive material (usually a metal such as silver, gold or aluminum but conductive non-metals can be used such as indium tin oxide or a heavily doped silicon). The gate 14 may be formed by any standard technique including ion implantation for doped silicon, thermal evaporation in vacuum or sputtering for metals, preferably through an appropriate mask. Alternatively, the substrate 25 may be eliminated by forming the gate 14 from a sufficiently thick conductive material such as an aluminum disk.

The insulator layer 11 is then formed onto the gate 14. The material for the insulator layer 11 is preferred to have a dielectric constant of at least 3 and may be a polymer (e.g., polyimides, poly(methylmethacrylate), polysulfene, etc.), an inorganic oxide (e.g., GeO, CaO, SiO, MgO, $SiO_2$, SnO, $SnO_2$), an inorganic fluoride (e.g., CsF, $CaF_2$, $MgF_2$, LiF), and an inorganic nitride (e.g., $Si_3N_4$). The thickness of the insulator layer 11 is most preferably as thin as possible while maintaining electrical insulation between the gate 14 and the semiconductor layer 15 within the voltage rating of the embodiment 10.

The semiconductor layer 15 is then formed onto the insulating layer by, for example, standard solution processes. The semiconductor layer 15 comprises a polymer. At least ten weight percent (preferably at least 20 weight percent and more preferably at least 30 weight percent) of the monomer units of the polymer being selected from the group consisting of a 9-substituted fluorene unit and a 9,9-substituted fluorene unit.

Examples of such polymers are described in U.S. Pat. No. 5,708,130, herein fully incorporated by reference; U.S. Pat. No. 5,777,070, herein fully incorporated by reference; U.S. patent application Ser. No. 08/861,469 filed May 21, 1997, herein fully incorporated by reference; U.S. Pat. No. 5,962,631, herein fully incorporated by reference; and WO99/54385, incorporated herein by reference.

Specifically, the polymers, preferably, have groups of the formula

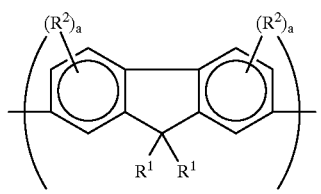

(IV)

wherein $R^1$ is independently in each occurrence $C_{1-20}$ hydrocarbyl or $C_{1-20}$ hydrocarbyl containing one or more S, N, O, P or Si atoms, $C_{4-16}$ hydrocarbyl carbonyloxy, $C_{4-16}$ aryl (trialkylsiloxy) or both $R^1$ may form with the 9-carbon on the fluorene ring a $C_{5-20}$ ring structure or a $C_{4-20}$ ring structure containing one or more heteroatoms of S, N or O;

$R^2$ is independently in each occurrence $C_{1-20}$ hydrocarbyl, $C_{1-20}$ hydrocarbyloxy, $C_{1-20}$ thioether, $C_{1-20}$ hydrocarbylcarbonyloxy or cyano and A is independently in each occurrence 0 or 1; and/or groups of the formula:

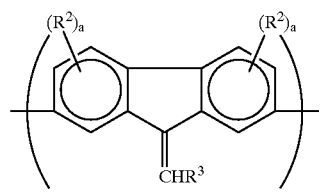

(V)

wherein $R^2$ and a are as defined above, and $R^3$ is independently in each occurrence $C_{1-20}$ hydrocarbyl or $C_{1-20}$ hydrocarbyl substituted with di($C_{1-20}$ alkyl) amino, $C_{1-20}$ hydrocarbyloxy or $C_{1-20}$ hydrocarbyl or tri($C_{1-10}$ alkyl)siloxy.

Comonomeric groups that may be used include:

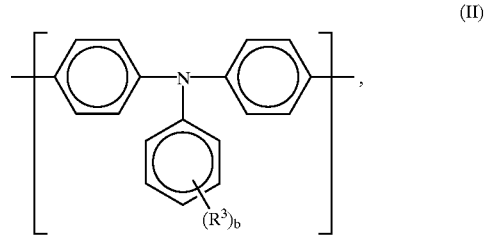

(II)

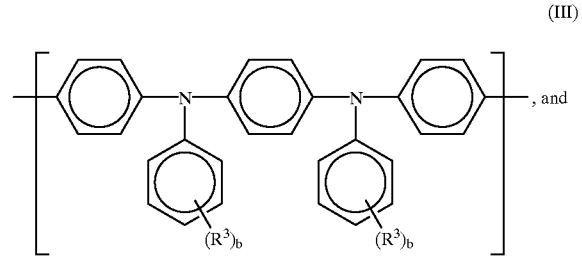

(III)

, and

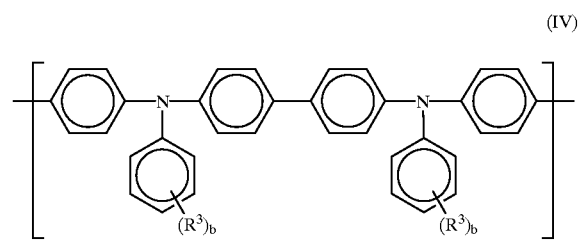

(IV)

$R^3$ is independently in each occurrence carboxyl, $C_1$–$C_{20}$ alkyl, $C_1$–$C_{20}$ alkoxy or a group of the formula —$CO_2R^4$ wherein $R^4$ is a $C_1$–$C_{20}$ alkyl; and b is independently in each occurrence an integer from 0 to 3. Examples of such copolymers include:

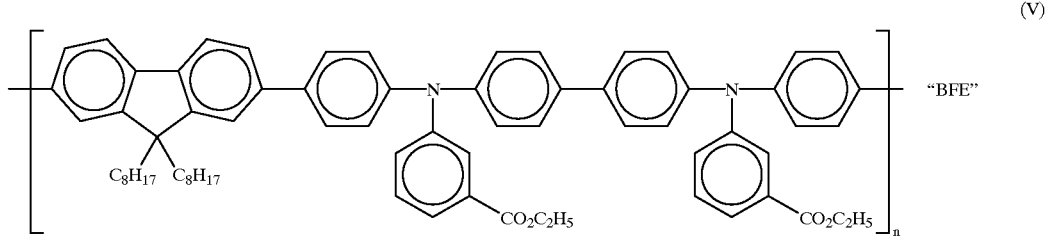

(V)

"BFE"

-continued
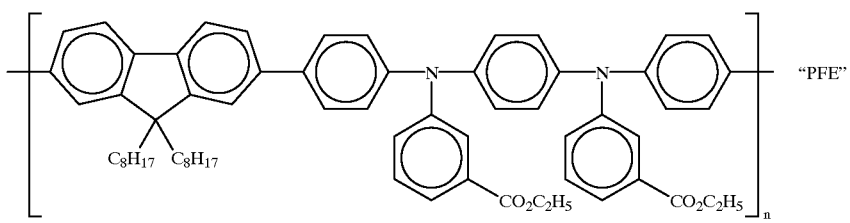
"PFE" (VI)
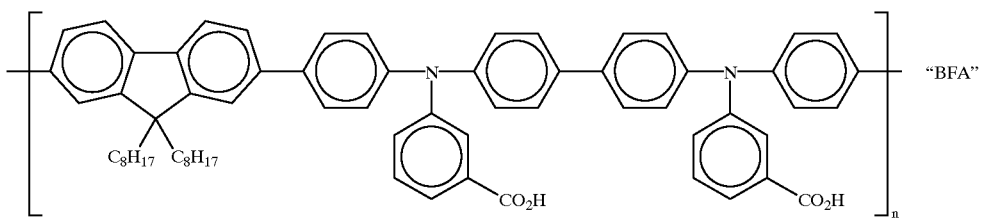
"BFA" (VII)
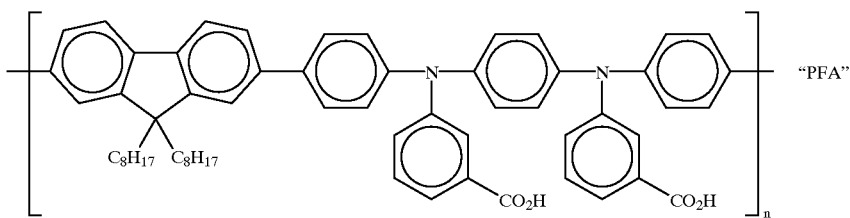
"PFA" (VIII)
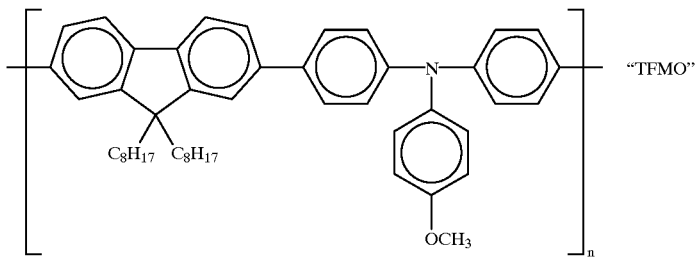
"TFMO" (IX)
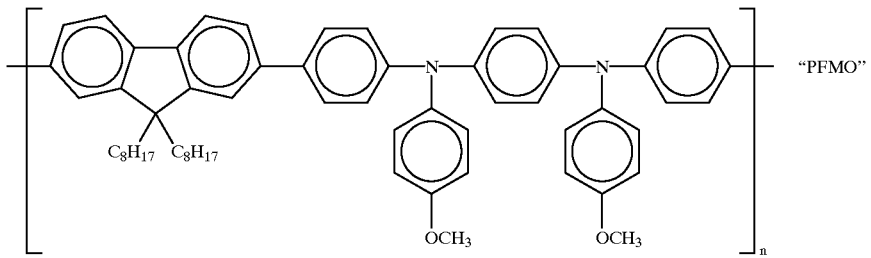
"PFMO" (X)
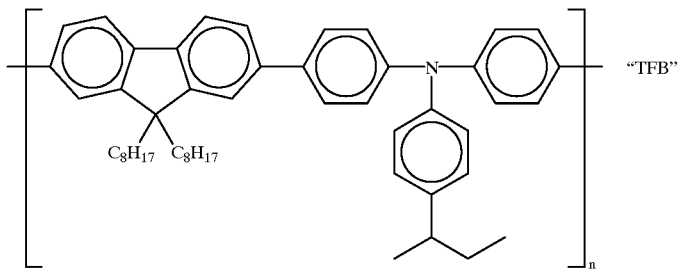
"TFB" (XI)

-continued

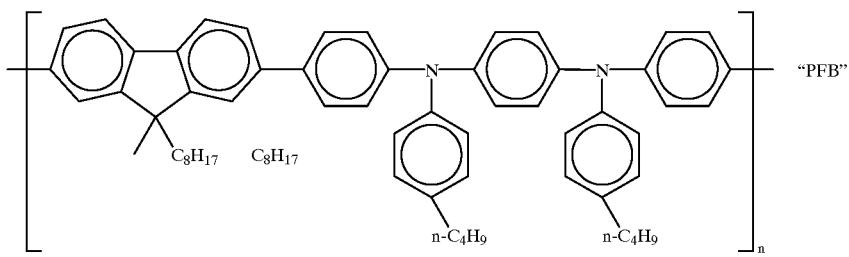

"PFB" (XII)

Other comonomeric groups include stilbene, tolan, $C_6$–$C_{20}$ mononuclear/polynuclear aromatic hydrocarbons, and $C_2$–$C_{10}$ mononuclear/polynuclear heterocycles. Examples of mononuclear/polynuclear aromatic hydrocarbons include benzene, naphthalene, acenaphthene, phenanthrene, anthracene, fluoranthene, pyrene, rubrene, and chrysene. Examples of mononuclear/polynuclear heterocycles include 5-member heterocycles such as furan, thiophene, pyrrole, oxazole, isooxazole, thiazole, isothiazole, imidazole, oxadiazoles, thiadiazole, and pyrazoles; 6-member heterocycles such as pyridine, pyridazine, pyrimidine, pyrazine, triazines, and tetrazenes; benzo-fused ring systems such as benzoxazole, benzothiazole, benzimidazole, quinoline, isoquinoline, cinnoline, quinazoline, quinoxaline, phthalazine, benzothiadiazole, and benzotriazines; and polynuclear condensed ring systems such as phenazine, phenanthridine, acridine, carbazole, and diphenylene oxide. In general, conjugated compounds containing up to 30 carbons are useful for the present purpose. They may be substituted optionally with one or more substituents that are not deleterious to the photoluminescent properties of the polymer compositions. Examples of substituents include $C_1$–$C_{20}$ hydrocarbyl radicals, $C_1$–$C_{20}$ (thio)alkoxy radicals, $C_1$–$C_{20}$ (thio)aryloxy radicals, cyano, fluoro, chloro, $C_1$–$C_{20}$ alkoxycarbonyl, $C_1$–$C_{20}$ aryoxylcarbonyl, $C_1$–$C_{20}$ carboxyl, and alkyl(aryl)sulfonyl radicals. Substituents which are known photoluminescent quenchers, such as arylcarbonyl and nitro, are undesirable. Conjugated monomeric units of more complex structures, as exemplified by Structures (1)–(8), may also be used.

(1)

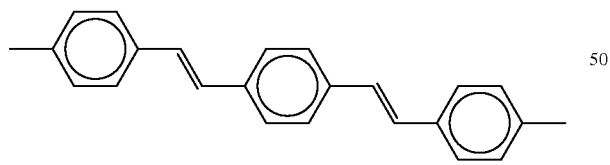

(2)

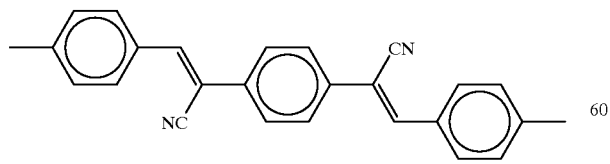

-continued (3)

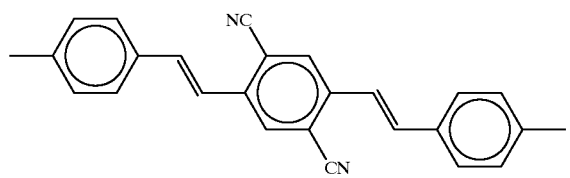

(4)

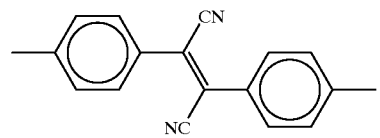

(5)

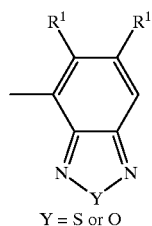

Y = S or O (6)

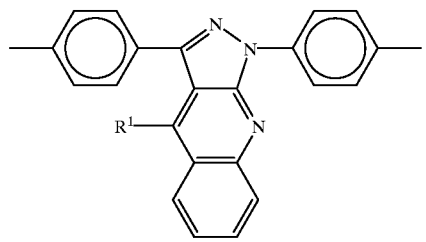

(7)

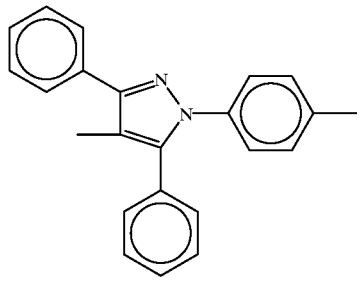

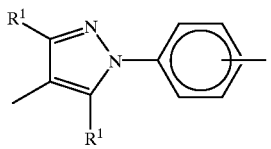

(8)

Preferred fluorene-containing polymers are those with high carrier mobility as measured by standard techniques such as time-of-flight experiments as described by Van der Auweraer, et al. in *Advanced Materials*, Vol. 6, p. 199, 1994. More preferred are fluorene-containing polymers with non-dispersive carrier transport behavior, e.g., poly(9,9-dioctylfluorene-2,7-diyl) described by Redecker, et al. in *Applied Physics Letters*, Vol. 73, p. 1565, 1998. Also preferred, are alternating fluorene copolymers with tertiary aromatic amines as described in the above referenced '469 and '187 U.S. Patent Applications. These polymers have carrier mobility of at least $1 \times 10^{-4}$ cm$^2$/volt-second.

The semiconductor layer 15 may comprise a mixture of polymers. The polymer of the semiconductor layer 15 can be homogeneous or phase separated; it may also be amorphous, semicrytalline or liquid crystalline in morphology. The polymer may also be aligned in the liquid crystalline state for enhanced carrier mobility as described by Grell, et al. in *Advanced Materials*, Vol. 9, p. 798, 1997. The thickness of the semiconductor layer 15 is not critical and may vary, for example, from 1 nm to 1000 nm, preferably 10 nm to 500 nm, most preferably 20 nm to 100 nm.

The source 20 and the drain 21 can then be deposited, for example, through a mask by sputtering or thermal evaporation in vacuum. Preferred materials for the source 20 and the drain 21 are gold, silver, or aluminum. A negative bias applied to the gate causes the formation of a conduction channel in the semiconductor layer 15 at or near its interface with the insulator 11. A current flows from the source 20 to drain 21 when the latter is made negative relative to the former. The MISFET of this invention are characterized by high on-off ratio and field effect mobility.

What is claimed is:

1. A field effect transistor, comprising:
   (a) an insulator layer, the insulator layer being an electrical insulator, the insulator layer having a first side and a second side;
   (b) a gate, the gate being an electrical conductor, the gate being positioned adjacent the first side of the insulator layer;
   (c) a semiconductor layer, the semiconductor layer comprising a copolymer of at least one fluorene-based monomer and at least one other conjugated monomer containing up to 30 carbon atoms, which other monomer is not a fluorene, at least ten weight percent of the monomer units of the copolymer being selected from the group consisting of a 9-substituted fluorene unit and a 9,9-substituted fluorene unit, the semiconductor layer having a first side, a second side, a first end and a second end, the second side of the semiconductor layer being adjacent the second side of the insulator layer;
   (d) a source, the source being an electrical conductor, the source being in electrical contact with the first end of the semiconductor layer; and
   (e) a drain, the drain being an electrical conductor, the drain being in electrical contact with the second end of the semiconductor layer.

2. The transistor of claim 1, wherein the semiconductor layer consists essentially of the copolymer.

3. The transistor of claim 1, wherein at least 20 weight percent of the monomer units of the copolymer are selected from the group consisting of a 9-substituted fluorene unit and a 9,9-substituted fluorene unit.

4. The transistor of claim 1, wherein at least 30 weight percent of the monomer units of the copolymer are selected from the group consisting of a 9-substituted fluorene unit and a 9,9-substituted fluorene unit.

5. The transistor of claim 1, wherein the semiconductor layer is in direct contact with the insulator layer and wherein the gate is in direct contact with the insulator layer.

6. The transistor of claim 1 wherein the other conjugated monomer is selected from the group consisting of aromatic amines, stilbenes, tolanes, $C_6$–$C_{20}$ mononuclear or polynuclear aromatic hydrocarbons, and $C_2$–$C_{10}$ mononuclear or polynuclear heterocycles.

7. The transistor of claim 1 wherein the other conjugated monomer is thiophene.

8. The transistor of claim 1 wherein the other monomer is selected from

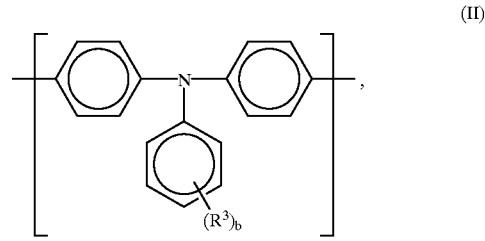

(II)

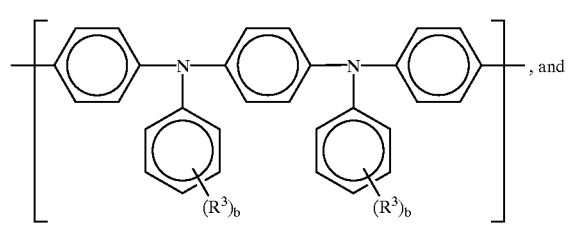

(III), and

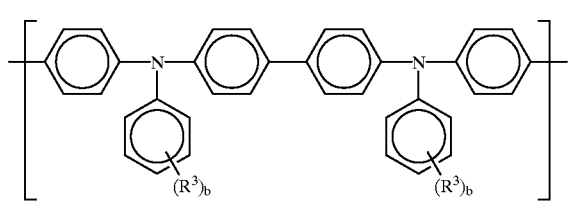

(IV)

wherein $R^3$ is independently, in each occurrence, carboxyl, $C_1$–$C_{20}$ alkyl, $C_1$–$C_{20}$ alkoxy or a group of the formula —$CO_2R^4$, wherein $R^4$ is a $C_1$–$C_{20}$ alkyl; and b is independently, in each occurrence, an integer from 0 to 3.

9. The transistor of claim 1 wherein the copolymer is an alternating copolymer.

10. The transistor of claim 1 wherein the copolymer is aligned.

11. The transistor of claim 1 wherein the copolymer has a carrier mobility of at least $1 \times 10^4$ cm$^2$/volt-second.

* * * * *